(12) United States Patent
Greene et al.

(10) Patent No.: US 7,884,640 B2
(45) Date of Patent: Feb. 8, 2011

(54) PLD PROVIDING SOFT WAKEUP LOGIC

(75) Inventors: Jonathan W Greene, Palo Alto, CA (US); Gregory Bakker, San Jose, CA (US); Vidyadhara Bellippady, San Jose, CA (US); Volker Hecht, Barsinghausen (DE); Theodore Speers, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/340,358

(22) Filed: Dec. 19, 2008

(65) Prior Publication Data

US 2010/0156457 A1    Jun. 24, 2010

(51) Int. Cl.
    *H03K 19/173* (2006.01)
(52) U.S. Cl. .............................. 326/38; 326/33; 326/41
(58) Field of Classification Search ........................ None
    See application file for complete search history.

(56) References Cited

U.S. PATENT DOCUMENTS

| | | | |
|---|---|---|---|
| 5,216,674 A | 6/1993 | Peter et al. | |
| 5,784,639 A | 7/1998 | Abramson | |
| 6,433,584 B1 * | 8/2002 | Hatae | 326/80 |
| 6,622,251 B1 | 9/2003 | Lindskog et al. | |
| 6,637,017 B1 | 10/2003 | Brophy | |
| 2002/0135398 A1 | 9/2002 | Choi et al. | |

2008/0030235 A1    2/2008   Sun et al.

FOREIGN PATENT DOCUMENTS

WO    2007/008579 A2    1/2007

OTHER PUBLICATIONS

International Search Report and Written Opinion mailed Mar. 1, 2010 in corresponding International Patent Application No. PCT/US2009/068856, 8 pages.
"IGLOO Industry's Lowest-Power FPGAs," URL http://www.actel.com/products/iglooseries/default.aspx, Actel Corporation, 6 pages, Mountain View, CA, USA.
"Actel's Flash Freeze Technology and Low-Power Modes," Igloo® Handbook. Actel Corporation, Date Unknown, pp. 1-24, Mountain View, CA, USA.
"Cyclone III FPGAs-Optimized for Low Power," URL http://www.altera.com/products/devices/cyclone3/overview/power/cy3-power.html, date unknown, printed Mar. 17, 2009, Altera Corporation, 2 pages, San Jose, CA, USA.
"Delivering the World's First Low-Cost 65-nm FPGAs," URL http://www.altera.com/products/devices/cyclone3/overview/power.html, Altera Corporation, date unknown, printed Mar. 17, 2009, 2 pages, San Jose, CA, USA.

(Continued)

*Primary Examiner*—Rexford N Barnie
*Assistant Examiner*—Jany Tran
(74) *Attorney, Agent, or Firm*—Lewis and Roca LLP

(57) ABSTRACT

A programmable logic device (PLD) with a plurality of programmable regions is disclosed. Some of the programmable regions have switch power or ground supplies to allow them to be put into a low-power state in one or more low-power modes. At least one of the programmable regions always remains on during the low-power modes to enable the user to design custom PLD power management logic that may be placed in the always-on programmable region.

27 Claims, 7 Drawing Sheets

OTHER PUBLICATIONS

"Achieving Low Power in 65-nm Cyclone III FPGAs,", White Paper, Apr. 2007, ver. 1.1, Altera Corporation, 7 pages, San Jose, CA, USA.

"MachXO—Most Versatile Non-Volatile PLD For Low-Density Applications," MachXO The All-in-One PLD, URL http://www.latticesemi.com/products/cpldspld/machxo/index.cfm, Lattice Semiconductors, Inc., date unknown, printed Mar. 17, 2009, 3 pages, Hillsborogh, Or, USA.

"Sleep Mode Reduces Standby Power to <100μA," URL http://www.latticesemi.com/products/cpldspld/machxo/sleepmodereducesstbypower.cfm, Lattice Semiconductor, Inc., date unknown, printed Mar. 17, 2009, 1 page, Hillsborogh, OR, USA.

"QuickLogic PolarPro™ Family Datasheet," QuickLogic Corporation, 2007, pages: cover page and 35-36 of 101 pages, most relevant, Sunnyvale, CA, USA.

"Minimizing Energy Consumption with Very Low Power Mode in PolarPro FPGAs," QuckLogic® Application Note 88, QuickLogic Corporation, 2006, 9 pages, Sunnyvale, CA, USA.

"ArcticLink™ Programmable Connectivity Solution Platform," ArcticLink Solution Platform Product Brief, QuickLogic Corporation, Feb. 2007, 6 pages, Sunnyvale, CA, USA.

"CoolRunner-II CPLD Family," DS090 (V3.0) Product Specification, Xilinx, Inc., Mar. 8, 2007, 16 pages, San Jose, CA, USA.

"Power Management Solutions," Spartan-3 Generation FPGA User Guide, Chapter 19, UG331 (v1.3), Xilinx, Inc., Feb. 14, 2008, pp. 483-502, San Jose, CA, USA.

"Using Suspend Mode in Spartan-3 Generation FPGAs", Application Note: Spartan-3A,Spartan-3AN, Spartan-3A DSP, XAPP480 (v1.0), Xilinix, Inc., May 2, 2007, 18 pages, San Jose, CA, USA.

"MSP430X47X3, MSP430X47X4 Mixed Signal Microcontroller," SLAS545A, Texas Instruments, Inc., May 2007, Revised Dec. 2007, 76 pages, Dallas, TX, USA.

Tuan, Tim et al., "A 90nm Low-Power FPGA for Battery-Powered Applications," Fourteenth ACM/SIGDA International symposium on Field-Programmable Gate Arrays, Monterey, California, Feb. 22-24, 2006, 9 pages, ACM, Inc., USA.

Office Action dated May 24, 2010 in co-pending U.S. Appl. No. 12/340,440, filed Dec. 19, 2008, 22 pages.

* cited by examiner

PLD PROVIDING SOFT WAKEUP LOGIC

BACKGROUND OF THE INVENTION

1. Field of the Invention

The Present invention relates to the field of integrated circuits. In particular, it relates to power management in programmable logic integrated circuit devices.

2. The Prior Art

Programmable Logic Devices (PLDs) are known in the art. A PLD comprises any number of initially uncommitted logic modules arranged in an array along with an appropriate amount of initially uncommitted routing resources. Logic modules are circuits which can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as, for example, wires, switches, multiplexers, and buffers. Logic modules, routing resources, and other features like, for example, I/O buffers and memory blocks, are the programmable elements of the PLD.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements like, for example, SRAM bits, lose their programming data when the PLD power supply is disconnected, disabled or turned off. Non-volatile control elements like, for example, antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and must be appropriate for the type of control element used.

An end user's PLD design is typically implemented by use of a computer program product (also known as software or, more specifically, design software) produced by the PLD manufacturer and distributed by means of a computer-readable medium like, for example, providing a CD-ROM to the end user or making the design software downloadable over the internet. Typically the manufacturer supplies a library of design elements as part of the computer program product. The library design elements provide a layer of insulation between the end user and the circuit details of the PLD features available to the end user like, for example, logic modules, memory blocks and programmable delay lines. This makes the design software easier to use for the end user and simplifies the manufacturer's task of processing the end user's complete design by the various tools in the design software.

Typically a user creates a logic design inside the manufacturer-supplied design software by entering schematics or describing it in a hardware description language like, for example, VHDL or Verilog. The design software then takes the completed design and converts it into the appropriate mix of configured logic modules and other programmable elements, maps them into physical locations inside the PLD, configures the interconnect to route the signals from one logic module to another, and generates the data structure necessary to assign values to the various control elements inside the PLD.

As semiconductor processing technology has advanced in recent years, transistor dimensions have continued to decrease. As a consequence, operating voltages for these small geometry transistors have also typically dropped—though this trend has slowed in the last few process nodes (130 nm, 90 nm and 65 nm) since the gate oxide thickness of the devices has not been scaled with the lateral transistor geometries in order to maintain operating voltages in the 1.0 volt to 1.2 volt range. The result has been transistors with very thin gate oxide layers, very short channel lengths, and low threshold voltages which produce substantially more leakage current than in previous generations. This has resulted in the static current of a CMOS integrated circuit typically becoming a substantial portion (and occasionally the majority) of the entire power budget. Dynamic power is also on the rise due to the ever increasing numbers of transistors that can be fit into an integrated circuit unmitigated by the traditional decreases in operating voltage.

As integrated circuit power consumption has been increasing, consumer demand for portable, battery-powered devices has also been on the rise. Power reduction is critical in such applications because battery life is a key component of both product usefulness and consumer acceptance. Even in non-portable systems, power reduction is an important issue in new electronic products by both semiconductor and systems manufacturers due to a variety of environmental concerns.

One response by the semiconductor industry is a design approach called Multi-Threshold CMOS (or MTCMOS). This is a loosely defined collection of design techniques which typically involves placing power or ground switching transistors in series with either the power or ground connection (or sometimes both) of various logic blocks to save leakage power when the blocks are not being used. Typically in MTCMOS the logic blocks are constructed with high-leakage/high-performance low threshold voltage (LVT) transistors and the power switches are constructed with low-leakage/low-performance high threshold voltage (HVT) transistors (hence the "multi-threshold" in MTCMOS), though often various parts of the circuit (in particular the logic blocks) are constructed with an optimized mix of LVT and HVT transistors. Sometimes a middle threshold voltage (MVT) transistor is also available giving the designer a choice of three different threshold voltages to use in trading off power and performance. A good summary of MTCMOS power switching techniques known in the art can be found in the WIPO published international patent application WO 2007/008579, which claims priority to U.S. provisional application 60/697,672.

PLD manufacturers have also been attempting to lower the power consumption of their parts and there have been a number of different families of PLDs and Field Programmable Gate Arrays (or FPGA—a type of PLD) which have one or more modes with reduced power consumption combined with reduced functionality (sometimes called a "standby" mode or a "low-power" mode or a "power-down" mode or a "sleep" mode) that the part can be placed in to reduce power when normal operation is not required. Reducing the power in the low-power mode or modes is critical in portable applications because typically the PLD will have long periods of inactivity and the static current during these times can be the majority of the total cost of the PLD to the battery life of the system.

FIG. 1 shows a system using a PLD of the prior art. In FIG. 1, PLD 100 has a PLD core 102 and a power control block 104. User logic 106 is programmed into the PLD core 102. There is a source of external system control logic 108 coupled to the power control block 104 in PLD 100 by interconnect 110. In order for the external system control logic 108 to place PLD 100 into sleep mode, a signal must be asserted on interconnect 110.

One drawback of this approach is there is no means of communication between power control block 104 and user logic 106. This means that there is no way for the PLD 100 to shut itself down in an orderly fashion relative to whatever is transpiring in user logic 106 at the time the sleep mode request is received in power control block 104. To achieve an orderly shutdown by stopping clocks and preserving the contents of sequential elements (like, for example, latches, registers, internal SRAM blocks, etc.) inside PLD core 102, then at least one optional interconnect 112 must be coupled between external system control logic 108 and user logic 106. This means that the designer of external system logic 108 must be familiar enough with the workings of user logic 106 to correctly generate the signals on optional interconnects 112 with respect to the signals on interconnect 110.

One commercial family using the general approach of FIG. 1 is the Spartan 3 family of FPGAs from Xilinx, Inc. of San Jose, Calif., which have both a "suspend" mode and a "hibernate" mode. In suspend mode, all of the SRAM configuration bits and the various sequential elements (latches, flip/flops, SRAM blocks, etc.) keep their logic states and some sources of quiescent power are turned off in response to a signal on a single pin. In hibernate mode, external power switches placed between the system power supplies and some or all (depending on the part) of the power supply pins of the FPGA effectively isolate them from the system power supplies (not shown in FIG. 1). Another commercial family using the FIG. 1 approach is the MachXO PLD family from Lattice Semiconductor Corporation of Hillsborough, Oreg. The MachXO family has a low-power mode where the power is reduced and the user logic is not functional in response to a single pin.

Xilinx experimented with the Spartan 3 PLD core attempting to reduce its power consumption and published the results in the paper *A 90 nm Low-Power FPGA for Battery Powered Applications* by Tuan et al presented at the FPGA '06 conference held in Monterey in February, 2006. According to the paper, Tuan et al produced a core that was compatible with the existing Spartan 3 software and existing process technology available to Xilinx. They made a number of hardware modifications, including reducing the voltage for the logic and routing portion of the PLD core from 1.2 Volts to 1.0 Volts, adopting the Virtex 4 FPGA family process for its middle oxide transistors to reduce gate leakage in the configuration SRAM bits, putting ground switch transistors in series with the ground connection of each repeatable tile in the core (a Spartan 3 tile is four logic modules and four flip-flops and the surrounding routing resources and support logic), and adding a configuration and power controller capable of saving the state of the core and manipulating the power switches by means of the configuration SRAM.

According to the paper, Tuan et al also modified the design software to exploit the hardware changes. A standby mode is available by storing the state of the flip-flops in configuration SRAM bits and then powering down all of the repeatable tiles by writing the appropriate value into the SRAM bits controlling the ground switch transistors. A partial standby mode is attained by selectively leaving certain tiles (and the logic and routing they contain) powered up so that a portion of the logic can be active during standby mode.

While Xilinx attained a considerable degree of power reduction success in the experiment, there is still room for improvement. According to the paper, Tuan et al considered improvements to the homogenous Spartan 3 derivative PLD core architecture and improved both the active and standby power significantly. Unfortunately, their implementation of partial standby mode leaves at least a portion of the regular PLD core active—albeit a reduced power PLD core. The larger the amount of logic required to be active during partial standby mode, the more costly it will be in terms of battery life since the PLD core isn't optimized for minimum leakage when active.

Also according to the paper, Tuan et al used a fairly fine grain in their minimum power switching unit—a Spartan 3 tile with four logic modules. Having many small regions like a Spartan 3 tile that can be powered up or down substantially increases the area required by the ground switch transistors. This contributes directly to power by increasing the area of the PLD core making wires longer and having more capacitance to drive in the active mode. Further, the amount of leakage in standby mode is directly proportional to the width of the ground switch transistors, so it is important to size them correctly. In a practical design, the ground switch transistors must be sized for the peak current they need to supply. Typically this is determined by running simulations on benchmark designs and observing maximum switching frequencies. With a coarse grain power-down block having a statistically significant number of logic modules, the size of the ground switch transistors can be tuned very closely to the real switching needs. In a fine grained block like the Spartan 3 tile with four logic modules, prudence would dictate allowing for at least two of the logic modules to switch simultaneously, which translates to sizing the ground switch transistors for an effective maximum switch rate of 50% which is too high to attain the minimum leakage current in standby mode.

FIG. 2 shows another system using a PLD of the prior art. In FIG. 2, PLD 200 has a PLD core 202 and a power control block 204. User logic 206 is programmed into the PLD core 202. There is a source of external system control logic 208 coupled to the power control block 204 in PLD 200 by interconnect 210. In PLD 200, interconnect 210 also couples to user logic 206 in PLD core 202, and one or more interconnects 211 couple between power control block 204 and user logic 206.

This approach overcomes a drawback to the PLD architecture of FIG. 1, since only a single interconnect line needs to be coupled between external system control logic 208 and PLD 200. When the external system control logic 208 signals PLD 200 to go into sleep mode by signaling on interconnect 210, user logic 206 can monitor the signal, place itself in a state appropriate for an orderly shutdown, communicate back and forth with the power control block 204 on interconnects 211, and then turn control over to power control block 204 to place PLD 200 in sleep mode. To wake up, power control block 204 receives a signal on interconnect 210 and wakes up the PLD 200 and initiates an orderly start in conjunction with the user logic 206. Thus external system control logic 208 can be designed without any detailed knowledge of user logic 206.

One commercial family using the general approach of FIG. 2 is the Igloo family of FPGAs from Actel Corporation of Mountain View, Calif., which has a "flash-freeze" mode. In flash-freeze mode, all of the various sequential elements (latches, flip/flops, SRAM blocks, etc.) keep their logic states since the PLD core remains powered up, however all clocks are shut off and certain circuits are placed in a low-power state.

One drawback to the approach of FIG. 2 is that there is still the need for external system control logic 208. This is undesirable since one of the purposes of using a PLD or FPGA in many applications is to consolidate all of the miscellaneous system logic into a single chip which is not possible in any commercial PLD with a low-power or sleep mode of the prior art.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 3:
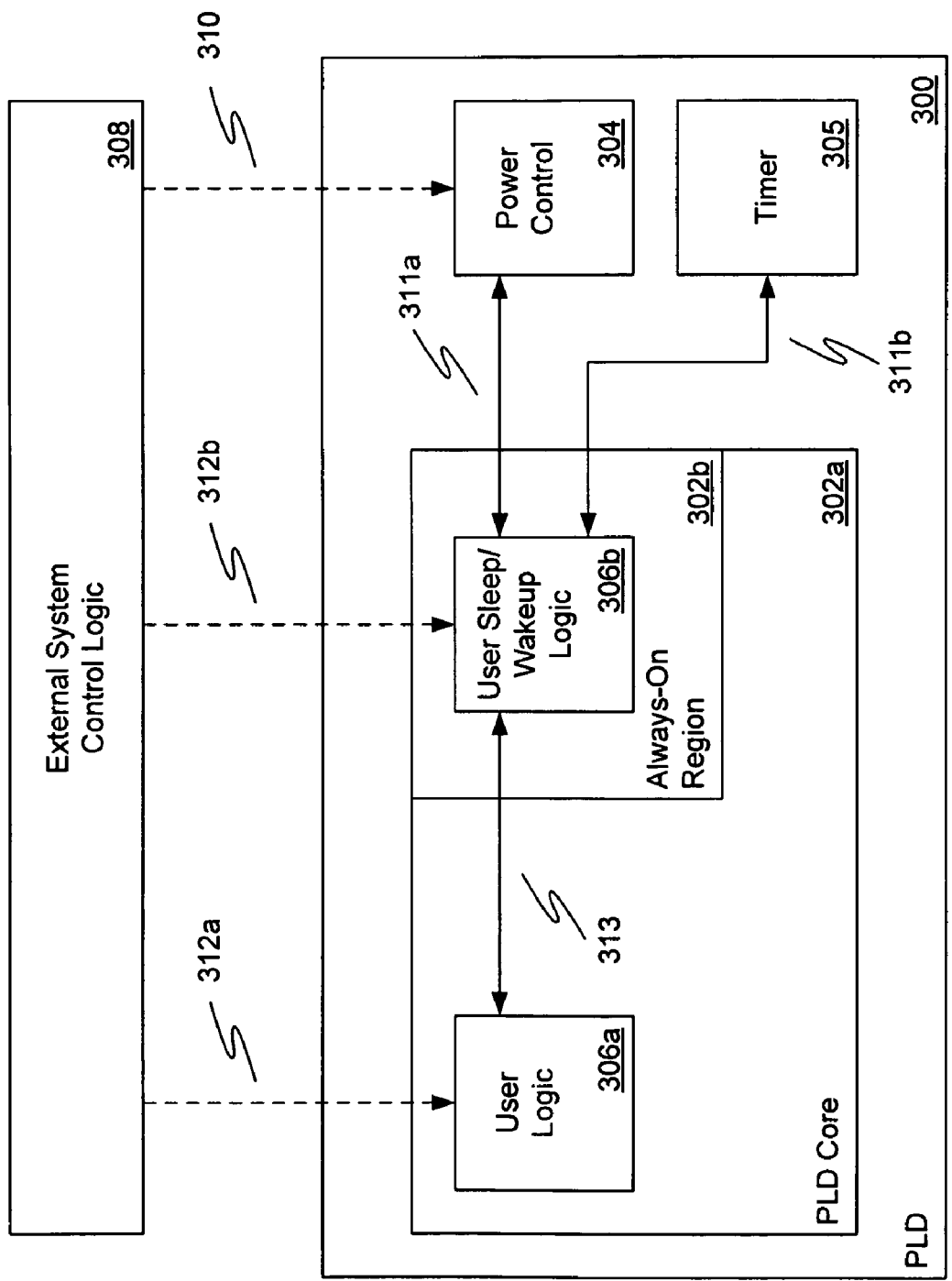
FIG. 3 illustrates a first PLD according to the present invention.

FIG. 3 shows an illustrative PLD 300 of the present invention. PLD 300 comprises a PLD core 302a that can be placed in a low-power or sleep mode. PLD core 302a has an always-on region 302b that always remains powered up as long as PLD 300 is powered up. The user's design is programmed into PLD core 302a and 302b together as a single design by the design software. The parts of the design that need to remain active during a low-power mode will be specified by the end user to be placed into always-on region 302b while the balance of the design will be placed into PLD core 302a which can be powered down (or otherwise placed in a low-power state with the power supplies still coupled to the power supply terminals in some embodiments). More details concerning the implementation and use of always-on regions in PLD cores will be described below.

PLD 300 further comprises a power control block 304 and timer block 305. Power control block 304 is a hardwired circuit that handles the various hardware functions required to enter one or more low-power or sleep modes and then subsequently wakeup. Timer block 305 is a hardwired circuit that provides hardware functionality that the end user may optionally utilize for controlling how long PLD 300 should remain in low-power or sleep mode. Such timer hardware could include, for example, such functions as a low-power oscillator combined with registers, counters and comparators for setting alarms and tracking both relative and absolute times as a function of counting the number of oscillator cycles, etc. This sort of timing block is sometimes called a timer, a counter/timer, or a real time clock (RTC).

FIG. 3 also shows external system control logic 308, which is optional in the present invention. External system control logic 308 is shown optionally coupled to user logic 306a that is programmed into PLD core 302a, user sleep/wakeup logic 306b that is programmed into always-on region 302b, and power control block 304 by optional interconnects 312a, 312b and 310 respectively. One or more of the optional interconnects 310, 312a and 312b may not be present, or that a single connection from external system control logic 308 may connect to one pin on PLD 300 and then be further coupled to user logic 306a, user sleep/wakeup logic 306b, and power control block 304 in any combination by optional internal interconnects—although those optional internal interconnections are not shown in the figure.

In FIG. 3, user sleep/wakeup logic 306b is shown coupled to power control block 304 through one or more interconnects 311a, to timer block 305 through one or more interconnects 311b, and to user logic 306a through one or more interconnects 313. While theses connections are available to user sleep/wakeup logic 306b, they are programmable elements and using them is optional. For example, if the user wishes to use a timer of his or her own design rather than use timer block 305, then it can be built as part of user sleep/wakeup logic 306b and timer block 305 can be powered down. Similarly, user sleep/wake logic 306b can be designed to operate power control block 304 in any mode the PLD manufacturer makes available. Thus the PLD could have multiple low-power modes with their use orchestrated by user sleep/wakeup logic 306b by manipulating inputs to power control block 304. While it is envisioned that PLD core block 302a would be powered down during at least one low-power mode in most portable applications (making user logic 306a unusable), it is entirely possible for user sleep/wakeup logic 306b to make use of portions of user logic 306a by selectively waking PLD core 302a for a time even during a sleep mode if additional functionality is needed. In various applications, user sleep/wake logic 306b could be used, for example, to monitor a group of programmable I/O pins to watch for a certain state or a change of state (either with or without reference to the timer) or to hold security keys in SRAM and erase them if a tamper condition is detected. Many other uses will suggest themselves to persons of ordinary skill in the art. Thus an extremely powerful and flexible level of programmable functionality is present in PLD 300 that was unavailable to users of prior art PLDs.

Figure 4:
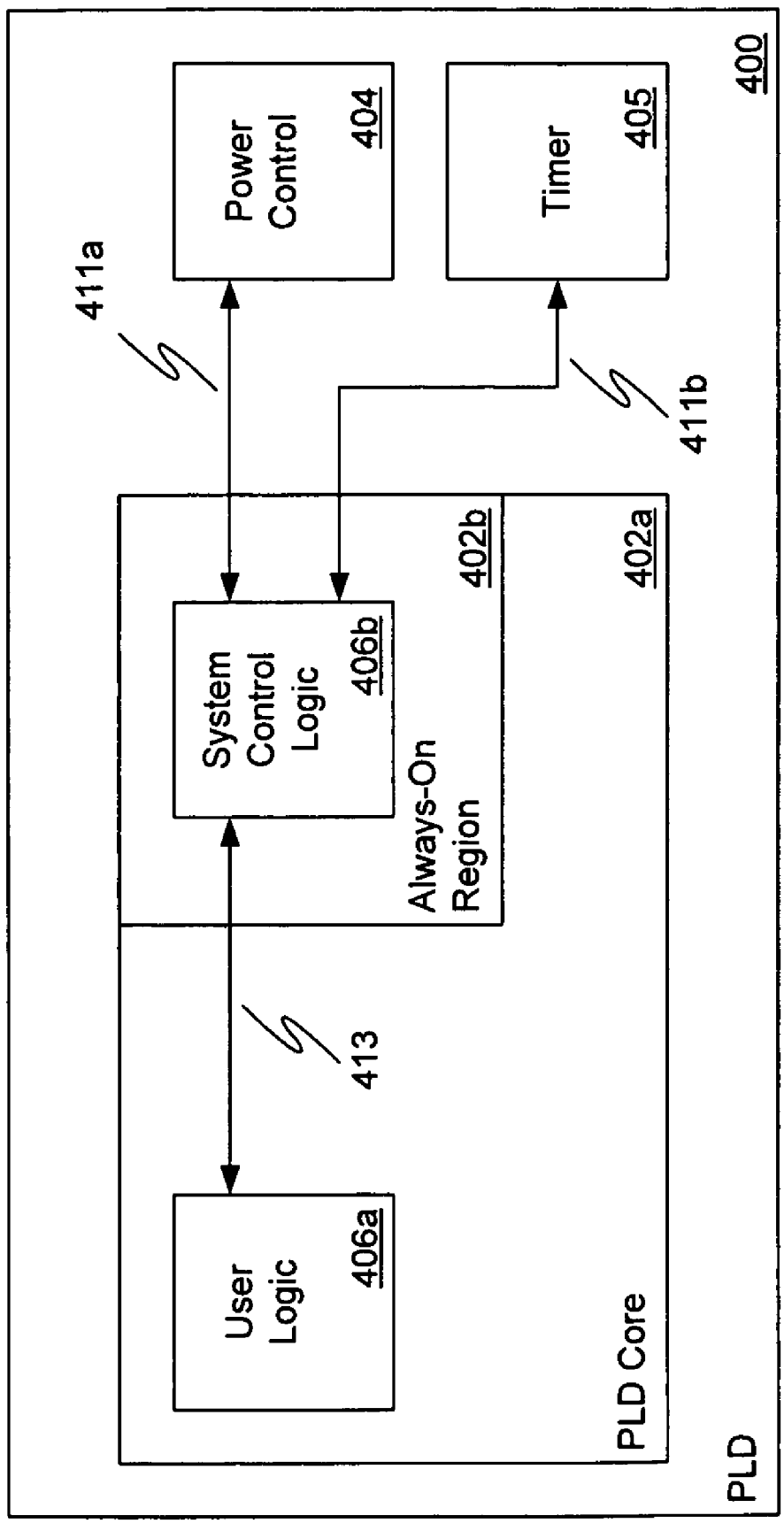
FIG. 4 illustrates a second PLD according to the present invention.

FIG. 4 shows illustrative PLD 400 of the present invention operating independently from any external control logic in a minimal configuration. PLD 400 comprises PLD core 402a that further comprises an always-on region 402b, power control block 404, timer block 405, user logic 406a programmed into PLD core 402a, and system control logic 406b programmed into always-on region 402b. System control logic 406b is shown coupled to power control block 404 through one or more interconnects 411a, to timer block 405 through one or more interconnects 411b, and to user logic 406a through one or more interconnects 413.

Figure 2:
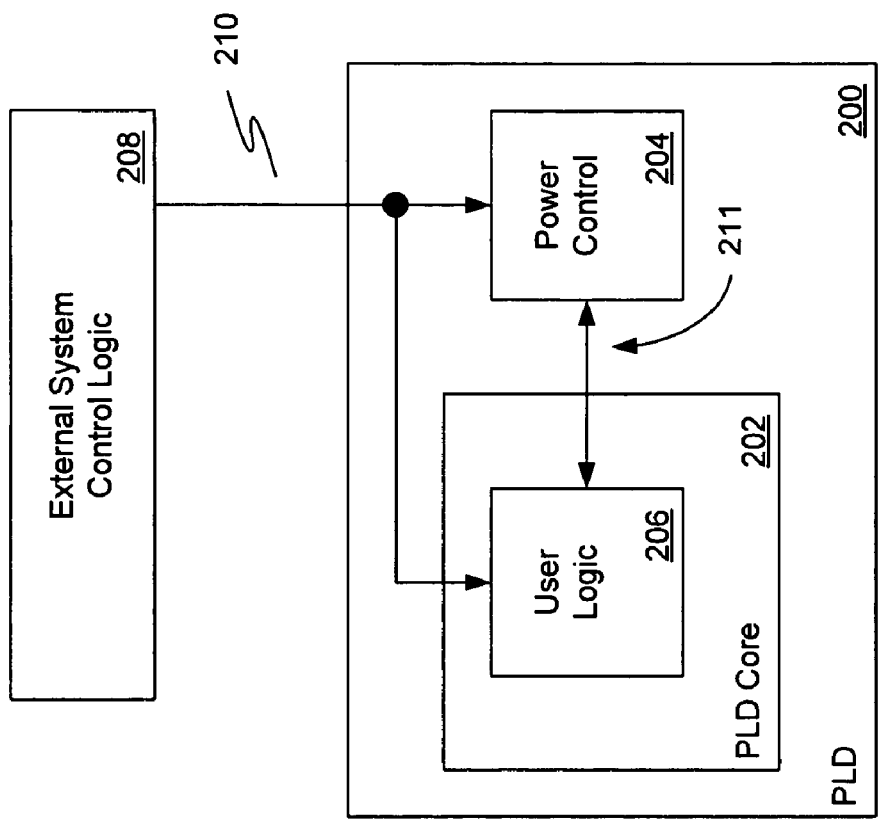
FIG. 2 illustrates another PLD of the prior art.
Figure 1:
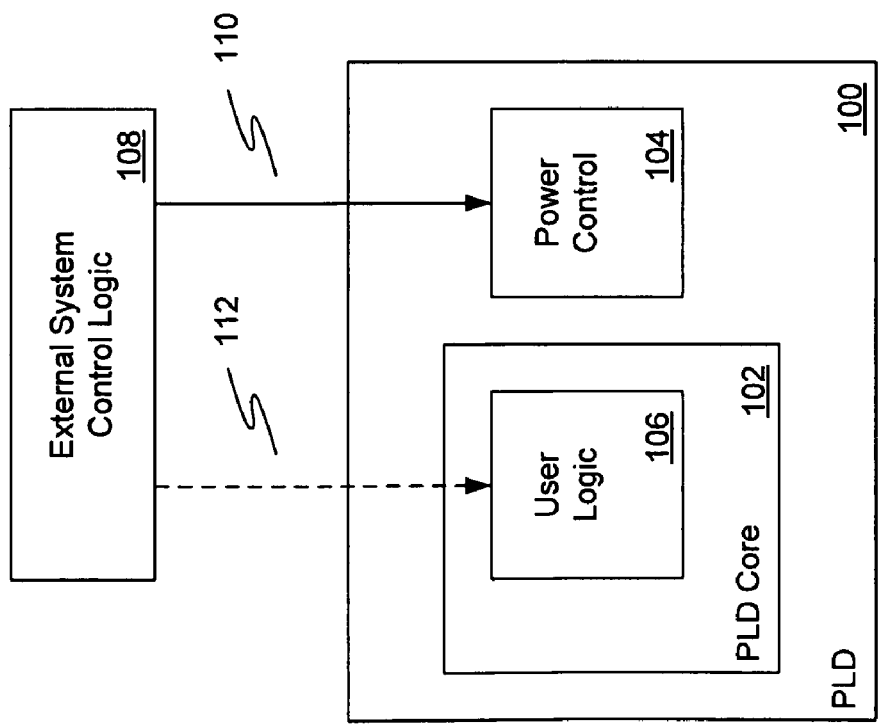
FIG. 1 illustrates a PLD of the prior art.

PLD 400 is not only capable of containing its own control function for determining when to go into sleep mode and when to wakeup, it can completely implement the system control logic. This can be completely specified by the end user and customized any way he wants within the size limit of always-on region 402b. By placing this portion of the programmable logic in a region that never powers down, the system control logic can safely control system sleep and wake activities, including putting most of PLD 400 to sleep. Thus a major drawback to the approach of FIG. 2 is overcome by the present invention.

In addition to using timer block 405 or some similar timing function for determining the correct time to wake up after a low-power mode is entered, system control logic 406b can also monitor external pins and watch for the application of specific signals to the inputs of PLD 400. In a commonly assigned patent application entitled "Programmable Logic Device with Programmable Wakeup Pins," Ser. No. 12/340, 440 filed on Dec. 19, 2008, the same day as this application, an FPGA with one or more wakeup groups of programmably selectable inputs for monitoring external signals in a low-power mode is disclosed. application Ser. No. 12/340,440, which is included in its entirety herein by reference, further describes wake on change, wake on vector, and wake on transition operations which can be specified by the user in conjunction with appropriate wakeup conditions. While application Ser. No. 12/340,440 describes special hardware for performing these functions, it also discloses that some of the special wakeup hardware could be implemented in programmable logic in a PLD where some of the logic is active in low-power mode (i.e., a PLD like PLD 400).

Figure 5:
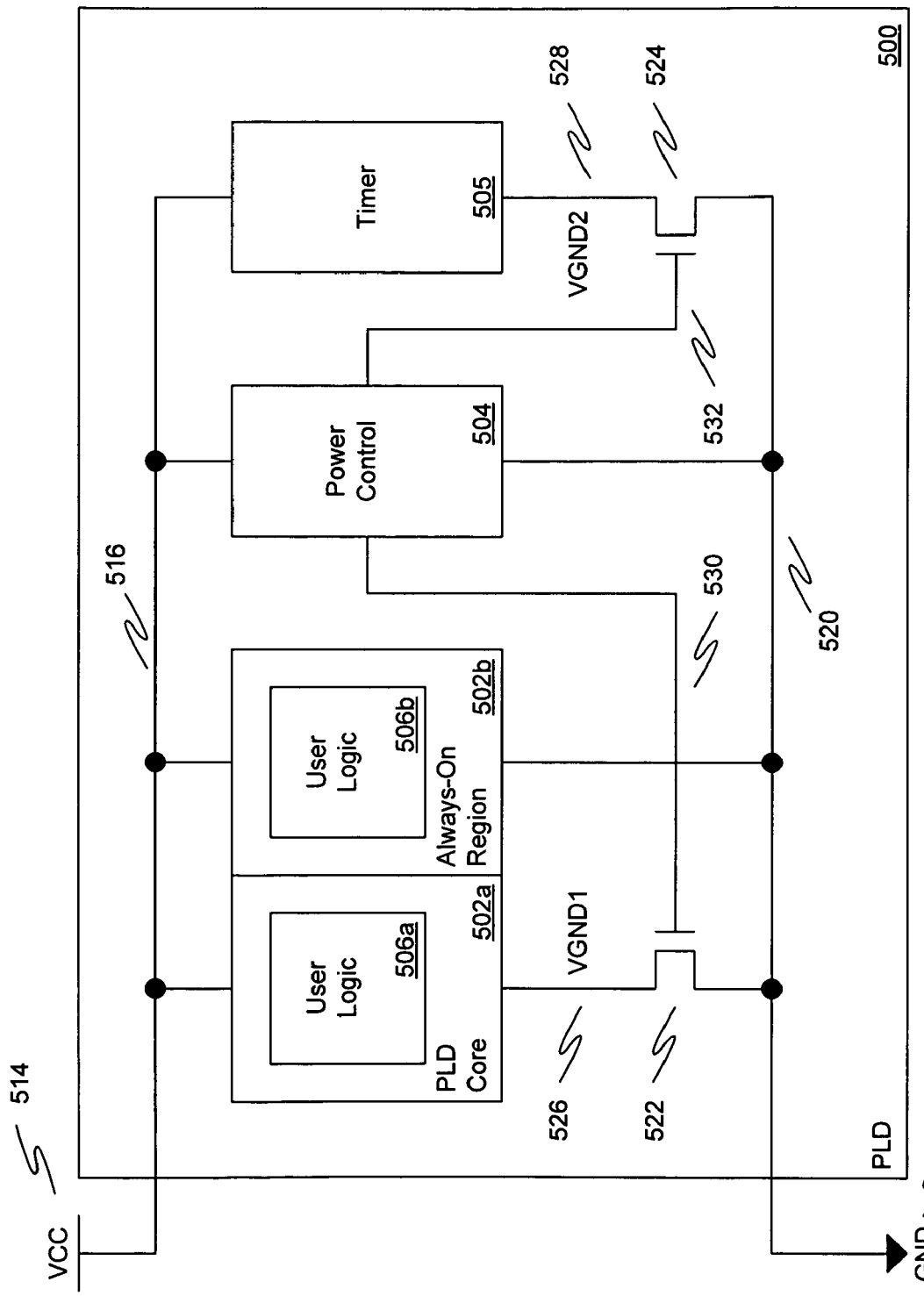
FIG. 5 illustrates a third PLD according to the present invention.

FIG. 5 shows illustrative PLD 500 of the present invention including some details of the power control circuitry. PLD 500 comprises PLD core 502a with an always-on region 502b, power control block 504, and timer block 505. User logic 506a is programmed into PLD core 502a and user logic 506b is programmed into always-on region 506b. External VCC supply 514 is coupled to internal power distribution line 516 inside PLD 500. External ground supply 518 is shown coupled to internal ground distribution line 520 inside PLD 500. Internal power distribution line 516 is coupled to PLD core 502a, to always-on region 502b, to power control block 504, and to timer block 505. Internal ground distribution line 520 is coupled to always-on region 502b, to power control block 504, and to two ground switch transistors 522 and 524.

Ground switch transistor 522 has two conductive terminals and a control terminal. The first conductive terminal is coupled to internal ground distribution line 520, the second conductive terminal is coupled to virtual ground VGND1 (labeled 526 in FIG. 5), and the control terminal is coupled to power control block 504 by interconnect 530. Ground switch transistor 522 is turned on or off by a signal from power control block 504 on interconnect 530. Turning on ground switch transistor 522 couples PLD core 502a to internal ground line 520 and enables normal operation, while turning off ground switch transistor 522 decouples PLD core 502a from internal ground line 520 disabling it.

In a similar manner, ground switch transistor 524 is coupled in series between internal ground distribution line 520 and virtual ground VGND2 (labeled 528 in FIG. 5). Ground switch transistor 524 is turned on or off by a signal from power control block 504 on interconnect 532. Turning on ground switch transistor 524 couples timer block 505 to internal ground line 520 and enables normal operation, while turning off ground switch transistor 524 decouples timer block 505 from internal ground line 520 disabling it.

While FIG. 5 shows blocks 502a and 505 having their ground connections being controllably coupled and decoupled, it is also possible that the VCC connections could either alternately coupled or decoupled or that both the VCC and ground connections together could be coupled or decoupled. In some embodiments, it might be desirable to couple and decouple the ground connection to one block and couple or decouple the VCC connection to another. Any and all of these combinations of power connections fall within the scope of the present invention.

Persons of ordinary skill in the art will appreciate that there will be many more blocks, circuits and features on a practically realizable PLD than are shown in the drawing figures. For example, many commercial PLDs have multiple VCC and ground connections (often with many different voltage levels applied to the various VCC connections) and these are not shown. A second example would be that when signals enter or leave a semiconductor device, they typically pass through package pins, bond wires, bonding pads, input buffers and output buffers which are not shown in any of the figures. A third example would be any other block present on the PLD may or may not have controllable power coupling as a matter of design choice. Such skilled persons will realize these simplifications have been made for clarity of presentation to avoid obscuring the present invention and overcomplicating the disclosure, and are in no way limiting.

Always-on region 502b can be constructed in a variety of different ways. The homogeneous approach is to use the same design as the rest of the PLD core 502a except for the ground connection being directly coupled to internal ground line 520 rather than through ground switch transistor 522. While this would be simplest and result in the least development cost, it would share one of the drawbacks of the Tuan et al approach since always-on region 502b would have active PLD core level leakage current during a low-power or sleep mode.

A first heterogeneous approach is to use a design similar to that used for PLD core 502a but using mostly or exclusively HVT transistors rather than the optimized mix of LVT, MVT and HVT transistors that would normally be used in the design of PLD core 502a.

A second heterogeneous approach to building always-on region 502b is to use a different design specifically geared towards low-power and low performance, since the portion of the user design contained in user logic 506b will typically run very slowly. This could be done by using a modified version of the design for PLD core 502a to reduce transistor sizes to a minimum wherever practical. Converting most or all of the transistors to HVT and using a thicker oxide transistor (if available) for most or all of the transistors would also be desirable with this approach.

Alternatively, a completely different circuit design or PLD architectural approach could be used in always-on region 502b. In some embodiments, always-on region 502b could be a second PLD core in its own right rather than as a region of PLD core 502a as a matter of design choice. While potentially the most effective approach and certainly the most heterogeneous, it is also potentially the most costly in terms development costs and time to market.

The advantage of taking a heterogeneous design approach for always-on region 502b with respect to the rest of the PLD core 502a is that static power can be reduced in always-on region 502b in ways that are incompatible with the performance requirements of PLD core 502a. Power reduction techniques like thicker gate oxide, higher threshold voltage, stacking transistors (replacing each transistor—or at least the most critical ones—in the design with two transistors in series), lowering the power supply voltage, etc., are well known in the art to be effective at static power reduction in operational circuits, but all come at a considerable cost in circuit performance and, in some cases, area as well.

Regardless of the approach, it is desirable in some embodiments to provide the always-on region with some special hardware not shown in any of the drawing figures. Such enhancements can include special dedicated input/output pads which are always powered up during low-power modes for monitoring external signals as part of a wakeup group of programmably selectable inputs; special clock distribution networks separate from the general purpose clock distribution networks in PLD core 502a, internally generated clocks (like an on-chip RC oscillator or a crystal oscillator) for clocking the always-on region, timer block 505, or any other circuit needing a clock during a power down mode; externally generated clocks for clocking the always-on region, timer block 505, or any other circuit needing a clock during a power down mode, and special ports for routing signals to and from PLD core 502a, power control block 504, timer block 505, and any other block on the PLD that needs to communicate with sleep/wakeup logic or system control logic. All of these options in any combination fall within the scope of the invention.

Figure 6A:
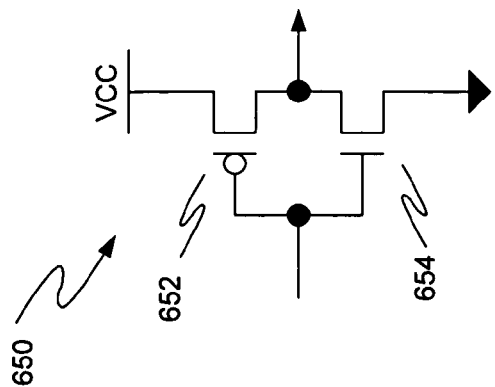
FIG. 6A illustrates a first CMOS inverter of the prior art suitable for use with the present invention.
Figure 6B:
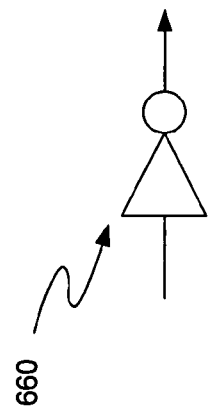
FIG. 6B illustrates a logic symbol for the CMOS inverter of FIG. 6A.

FIG. 6A shows a CMOS inverter 650 of the prior art. CMOS inverter 650 comprises PMOS transistor 652 coupled together with NMOS transistor 654 in a series arrangement between VCC and ground. The gates of transistors 652 and 654 are coupled together forming an input while the drains of transistors 652 and 654 are coupled together to form an output. In normal operation, when the input of CMOS inverter 650 is driven to ground the output is driven to VCC and when the input is driven to VCC the output is driven to ground. FIG. 6B shows a logic symbol 660 representing the CMOS inverter 650 circuit of FIG. 6A.

Figure 7A:
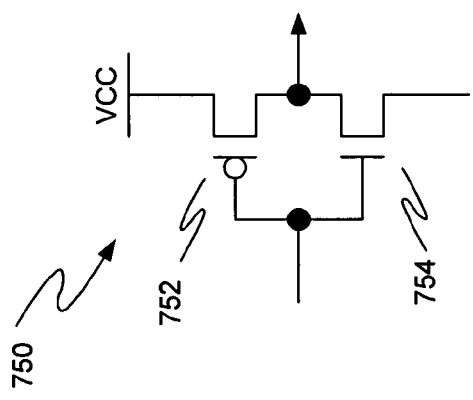
FIG. 7A illustrates a second CMOS inverter of the prior art suitable for use with the present invention.
Figure 7B:
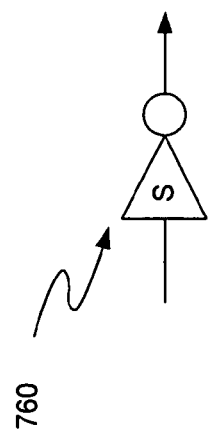
FIG. 7B illustrates a logic symbol for the CMOS inverter of FIG. 7A.

FIG. 7A shows a CMOS inverter 750 of the prior art. CMOS inverter 750 comprises PMOS transistor 752 coupled together with NMOS transistor 754 in a series arrangement between VCC and a virtual ground labeled VGND in the figure. The gates of transistors 752 and 754 are coupled together forming an input while the drains of transistors 752 and 754 are coupled together to form an output. In normal operation, when the input of CMOS inverter 750 is driven to ground the output is driven to VCC and when the input is driven to VCC the output is driven to ground. FIG. 7B shows a logic symbol 760 representing the CMOS inverter 750 circuit of FIG. 7A.

Figure 8A:
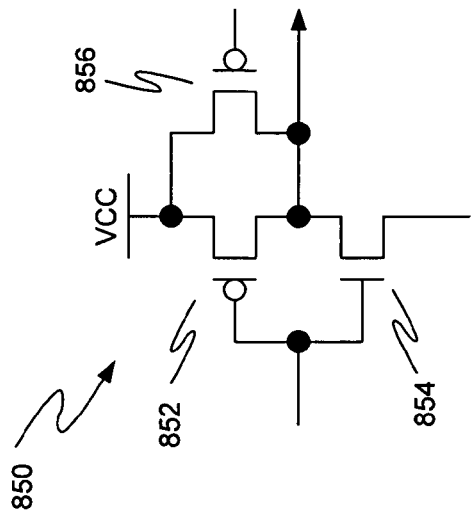
FIG. 8A illustrates a third CMOS inverter of the prior art suitable for use with the present invention.
Figure 8B:
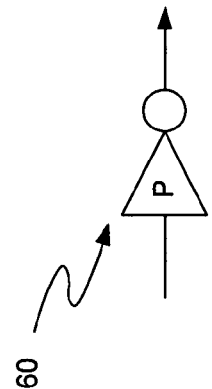
FIG. 8B illustrates a logic symbol for the CMOS inverter of FIG. 8A.

FIG. 8A shows a CMOS inverter 850 of the prior art. CMOS inverter 850 comprises PMOS transistor 852 coupled together with NMOS transistor 854 in a series arrangement between VCC and a virtual ground labeled VGND in the figure. The gates of transistors 852 and 854 are coupled together forming an input while the drains of transistors 852 and 854 are coupled together to form an output. In normal operation, when the input of CMOS inverter 850 is driven to ground the output is driven to VCC and when the input is driven to VCC the output is driven to ground. PMOS transistor 856 is shown coupled between VCC and the output. The gate of PMOS transistor 856 is coupled to a control signal which selectively turns PMOS transistor 856 on or off. In normal operation, PMOS transistor 856 is turned off. In certain modes, like, for example, when entering a sleep mode, PMOS transistor 856 will be turned on driving the output to VCC. FIG. 8B shows a logic symbol 860 representing the CMOS inverter 850 circuit of FIG. 8A.

Figure 9:
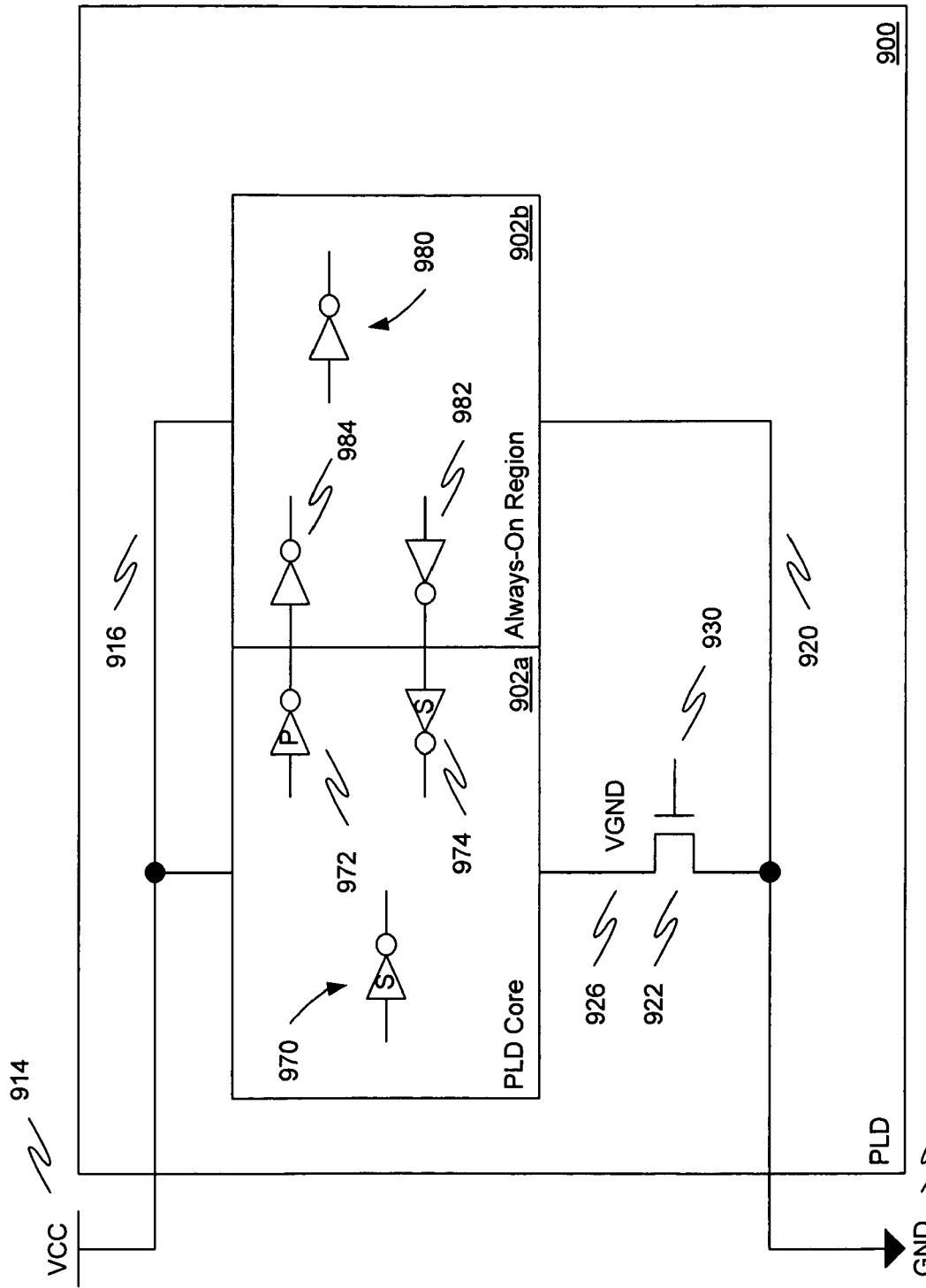
FIG. 9 illustrates a fourth PLD according to the present invention.

FIG. 9 shows illustrative PLD 900 having a PLD core 902a with an always-on region 902b according to the present invention including some details of the interface between PLD core 902a and always-on region 902b. In the figure, external VCC source 914 is coupled to internal VCC distribution line 916 which in turn is coupled to PLD core 902a and always-on region 902b. External ground source 918 is shown coupled to internal ground distribution line 920 which in turn is coupled to always-on region 902b and ground switch transistor 992. Ground switch transistor 922 couples or decouples internal ground distribution line 920 to virtual ground VGND (labeled 926 in FIG. 9) in response to a control signal on interconnect line 930 coupled to the gate of ground switch transistor 922. During normal operation, ground switch transistor 922 is turned on. When placing PLD core 900 into a sleep mode is desired, ground switch transistor 922 is turned off.

Care must be taken at the interface between FPGA core 902a and always-on region 902b to avoid any sneak current paths which could draw unexpected current in a low-power mode. During normal operation when ground switch transistor 922 is turned on, there will be no sneak paths in a property designed CMOS interface. When ground switch transistor 922 is turned off, the potential for unwanted current flow is present.

A simple illustrative interface is shown in FIG. 9. CMOS inverter 970 is representative of all CMOS logic gates that are completely internal to PLD core 902a. CMOS inverter 972 is representative of all CMOS gates internal to PLD core 902a that drive a signal line across the interface into always-on region 902b. CMOS inverter 974 is representative of all CMOS gates internal to PLD core 902a that receive a signal line from across the interface from always-on region 902b. CMOS inverter 980 is representative of all CMOS logic gates that are completely internal to always-on region 902b. CMOS inverter 982 is representative of all CMOS gates internal to always-on region 902b that drive a signal line across the interface into PLD core 902a. CMOS inverter 984 is representative of all CMOS gates internal to always-on region 902b that receive a signal line from across the interface from PLD core 902a.

CMOS inverters 980, 982 and 984 all use the circuit shown in FIG. 6A since they are in always-on region 902b and their ground connection is never switched. CMOS inverters 970 and 974 use the circuit shown in FIG. 7A because they are in PLD core 902a (where their ground connection is switched) and they are not driving signals across the interface into always-on region 902b. CMOS inverter 972 uses the circuit of FIG. 8A because it is in PLD core 902a (where its ground connection is switched) and it drives a signal into always-on region 902b.

CMOS inverter 982 drives a signal line coupled to the input of CMOS inverter 974. This observes an important design principle of this illustrative interface that any signal crossing the interface should only be coupled to the gates of PMOS and NMOS transistors. This ensures that any live driver in always-on region 902b will only see high impedance when looking into PLD core region 902a. This means that CMOS pass transistors, transmission gates, and other CMOS logic gates with a PMOS or NMOS source or drain terminal coupled to a gate input should not be directly coupled to a signal line that crosses the interface.

CMOS inverter 972 drives a signal line coupled to the input of CMOS inverter 984. This observes an important design principle of this illustrative interface that the input to an always-on CMOS gate must always be driven to either VCC or ground except for brief periods during logic transitions. PMOS transistor 856 inside CMOS inverter 972 will force the output coupled to CMOS inverter 982 to VCC when the ground connection to PLD core 902a is decoupled from internal ground distribution line 920, thus remaining consistent with the design principle.

Persons skilled in the art will realize that a more complicated interface that violates the important design principles of the illustrative interface of FIG. 9 could be constructed and that the choice of this particular illustrative interface is for simplicity of presentation and to avoid overcomplicating the disclosure. Such skilled persons will realize that many interface designs could be used with the present invention, that the important issue is that the interface be designed with sufficient care so that no unnecessary power is consumed when low-power modes are entered, and that the choice of the illustrative interface shown in FIG. 9 in no way limits the present invention.

Figure 10:
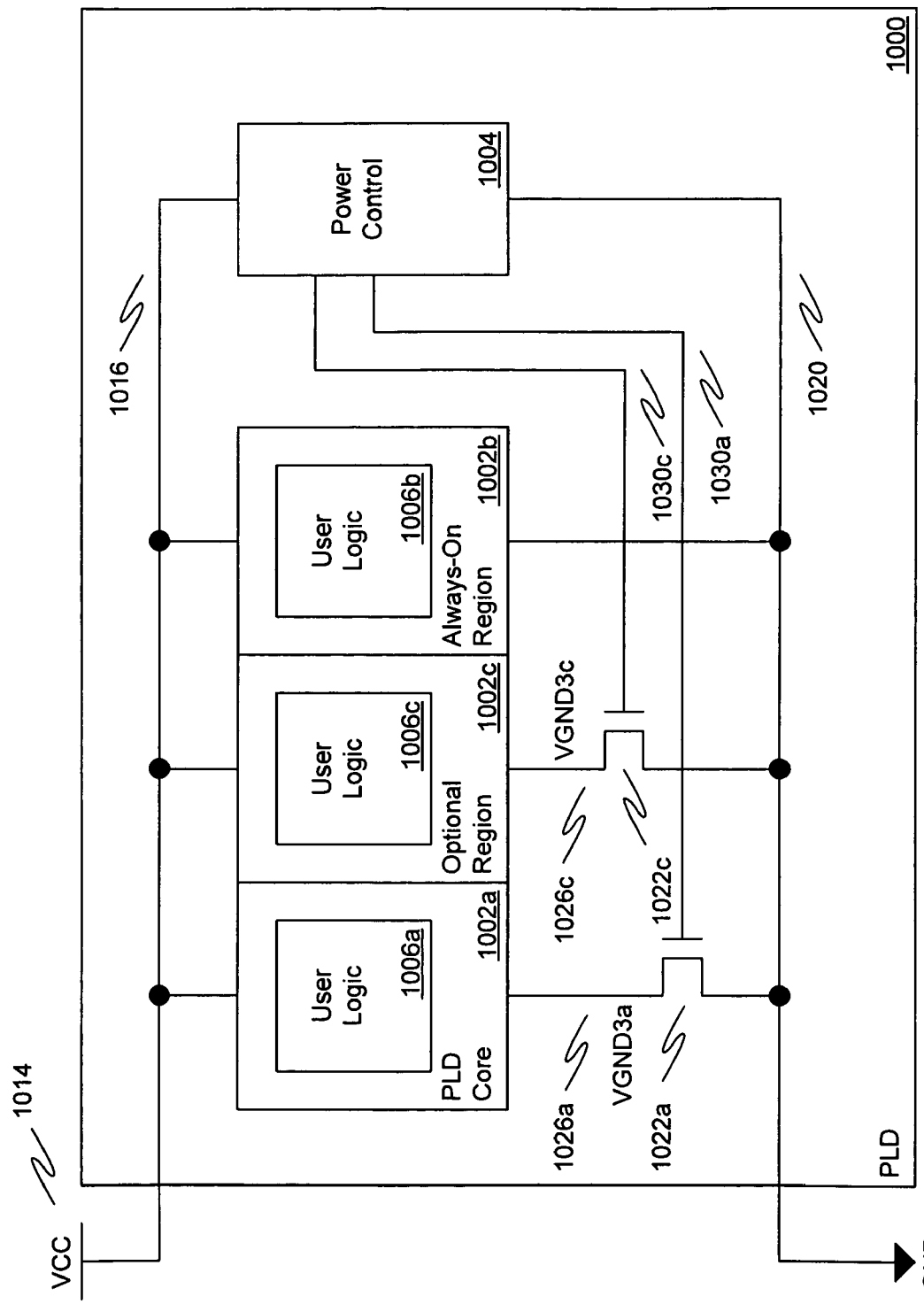
FIG. 10 illustrates a fifth PLD according to the present invention.

FIG. 10 shows illustrative PLD 1000 of the present invention. PLD 1000 comprises PLD core 1002a, which has both an always-on region 1002b and an optional region 1002c, and power control block 1004. User logic 1006a is programmed into PLD core 1002a, user logic 1006b is programmed into always-on region 1006b, and user logic 1006c is programmed into optional region 1002c. External VCC supply 1014 is coupled to internal power distribution line 1016 inside PLD 1000. External ground supply 1018 is shown coupled to internal ground distribution line 1020 inside PLD 1000. Internal power distribution line 1016 is coupled to PLD core 1002a, to always-on region 1002b, to optional region 1002c, and to power control block 1004. Internal ground distribution line 1020 is coupled to always-on region 1002b, to power control block 1004, and to two ground switch transistors 1022a and 1022c. Persons skilled in the art will realize that other blocks and ground switch transistors not shown may be present on PLD 1000 (and in any of the other embodiments of the invention) and that the absence of these blocks in the figure is to avoid overcomplicating the disclosure.

Ground switch transistor 1022a is coupled in series between internal ground distribution line 1020 and virtual ground VGND3a (labeled 1026a in FIG. 10). Ground switch transistor 1022 is turned on or off by a signal from power control block 1004 on interconnect 1030a. Turning ground switch transistor 1022a on couples PLD core 1002a to internal ground line 1020 and enables normal operation, while turning ground switch transistor 1022 off decouples PLD core 1002a from internal ground line 1020 turning it off.

In a similar manner, ground switch transistor 1022c is coupled in series between internal ground distribution line 1020 and virtual ground VGND3c (labeled 1026c in FIG. 10). Ground switch transistor 1022c is turned on or off by a signal from power control block 1004 on interconnect 1030c. Turning ground switch transistor 1022c on couples optional block 1002c to internal ground distribution line 1020 and enables normal operation, while turning ground switch transistor 1022c off decouples optional block 1002c from internal ground line 1020 turning it off.

Since it is anticipated that in most embodiments always-on region 1002b will be a small fraction of the entire PLD core 1002a, the inclusion of optional block 1002c in PLD 1000 allows the user greater flexibility in designing his sleep/wakeup or system control logic by providing a user selectable amount of programmable logic that can be left on or turned off in one or more low-power modes. If optional region 1002c is always left on, it allows the user to build a larger and more complex sleep/wakeup or system control logic function. If the user logic 1006c programmed into optional region 1002c is a non-critical part of the sleep/wakeup logic, then the critical portion can be programmed into user logic 1006b in always-on region 1002b and can turn optional region 1002c on or off as needed without the need to turn on the entire PLD core 1002a when the non-critical functionality is needed.

Optional region 1002c can be constructed in a manner homogeneous with the PLD core 1002a or in a manner homogeneous with always-on region 1002b, though the latter would be more desirable for power reduction. For additional flexibility, multiple optional regions—possibly of different sizes—could be added and they could all be homogenous with PLD core 1002a or always-on region 1002b—or a mixture of the two types of regions could be used.

Some care is required to ensure that user logic will function correctly. The place and route tool (or tools) present in the design software provided by the PLD manufacturer used to generate the programming data structure must keep ordinary logic in the PLD core 1002a (or in the optional region 1002c) and the sleep/wakeup or system control logic in always-on region 1002b. This involves searching the user logic at one or more points in the design flow, properly identifying the logic that must always remain on, and then properly placing and routing that logic in the appropriate region or regions. Of course, some ordinary logic may be placed in always-on region 1002b provided there is extra room left and the speed of the region is adequate to support that logic. Also, logic in the always-on region must be designed to allow for the logic state of signals crossing the interface from the PLD core 1002a during power down modes.

In some embodiments, the PLD will incorporate dedicated carry circuitry to support arithmetic functions. These carry chains typically run in one direction across the PLD core. It may be more desirable to have such carry chains flow from the always-on region 1002b to the PLD core 1002a to avoid carry chain initialization or arithmetic block placement issues near the interface between the regions.

While embodiments and applications of this invention have been shown and described, it would be apparent to those of ordinary skill in the art that many more modifications than mentioned above are possible without departing from the inventive concepts herein. The invention, therefore, is not to be restricted except in the spirit of the appended claims.

What is claimed is:

1. A programmable logic integrated circuit device adapted to enter a low-power mode, the device comprising:
   first and second voltage supply distribution lines each adapted to couple to an external voltage source;
   a first transistor having a control terminal and first and second conductive terminals, the first conductive terminal coupled to the second supply distribution line;
   a programmable logic device core coupled to the control circuit, and including a first region comprising a plurality of logic modules and having a first supply terminal coupled to the first supply distribution line, a second supply terminal coupled to the second supply distribution line, and a second region comprising a plurality of logic modules and having a third supply terminal coupled to the first supply distribution line and a fourth supply terminal coupled to the second conductive terminal of the transistor; and
   a control circuit coupled to drive the control terminal of the first transistor, the control circuit further coupled to send at least one signal to the first region of the programmable logic device core and to receive at least one signal from the second region of the programmable logic device core.

2. The programmable logic integrated circuit device of claim 1, wherein: the voltage potential applied to the first voltage supply distribution line is greater than the voltage potential applied to the second voltage supply distribution line.

3. The programmable logic integrated circuit device of claim 2, wherein the voltage potential applied to the second voltage supply distribution line is ground.

4. The programmable logic integrated circuit device of claim 1, wherein: the voltage potential applied to the second voltage supply distribution line is greater than the voltage potential applied to the first voltage supply distribution line.

5. The programmable logic integrated circuit device of claim 4, wherein the voltage potential applied to the first voltage supply distribution line is ground.

6. The programmable logic integrated circuit device of claim 1, further comprising: an external signal input line coupled to the control circuit and to the first region.

7. The programmable logic integrated circuit device of claim 6, wherein the external signal input line is also coupled to the second region.

8. The programmable logic integrated circuit device of claim 6, wherein:
the first region is adapted to remain active during a low-power mode; and
the second region is adapted to enter a low-power state during a low-power mode.

9. The programmable logic integrated circuit device of claim 1, further comprising: a timer circuit coupled to the first region.

10. The programmable logic integrated circuit device of claim 1, wherein the first and second regions are substantially physically adjacent.

11. The programmable logic integrated circuit device of claim 1, wherein the first and second regions are substantially physically separated.

12. The programmable logic integrated circuit device of claim 1, wherein the first region comprises a smaller number of logic modules than the second region.

13. The programmable logic integrated circuit device of claim 1, wherein: the second region comprises a smaller number of logic modules than the first region.

14. The programmable logic integrated circuit device of claim 1, wherein the construction of the second region is heterogeneous with respect to the construction of the first region.

15. The programmable logic integrated circuit device of claim 14, wherein the voltage potential applied to the first voltage supply distribution line is greater than the voltage potential applied to the second voltage supply distribution line.

16. The programmable logic integrated circuit device of claim 15, wherein the voltage potential applied to the second voltage supply distribution line is ground.

17. The programmable logic integrated circuit device of claim 14, wherein the voltage potential applied to the second voltage supply distribution line is greater than the voltage potential applied to the first voltage supply distribution line.

18. The programmable logic integrated circuit device of claim 17, wherein the voltage potential applied to the first voltage supply distribution line is ground.

19. The programmable logic integrated circuit device of claim 14, further comprising an external signal input line coupled to the control circuit and to the first region.

20. The programmable logic integrated circuit device of claim 19, wherein the external signal input line is also coupled to the second region.

21. The programmable logic integrated circuit device of claim 14, further comprising: a timer circuit coupled to the programmable logic core.

22. The programmable logic integrated circuit device of claim 14, wherein the first and second regions are substantially physically adjacent.

23. The programmable logic integrated circuit device of claim 14, wherein the first and second regions are substantially physically separated.

24. The programmable logic integrated circuit device of claim 14, wherein the first region comprises a smaller number of logic modules than the second region.

25. The programmable logic integrated circuit device of claim 14, wherein the second region comprises a smaller number of logic modules than the first region.

26. The programmable logic integrated circuit device of claim 14, wherein:
the first region is adapted to remain active during a low-power mode; and
the second region is adapted to enter a low-power state during a low-power mode.

27. The programmable logic integrated circuit device of claim 1, wherein:
the first region is adapted to remain active during a low-power mode; and
the second region is adapted to enter a low-power state during a low-power mode.

* * * * *